(12) United States Patent
Purple et al.

(10) Patent No.: US 7,641,933 B2
(45) Date of Patent: Jan. 5, 2010

(54) INTEGRATED CAPACITOR ASSEMBLY

(75) Inventors: Robert Purple, Myrtle Beach, SC (US); Marilynn Young, Conway, SC (US); Larry Eisenberger, Myrtle Beach, SC (US)

(73) Assignee: AVX Corporation, Myrtle Beach, SC (US)

( * ) Notice: Subject to any disclaimer, the term of this patent is extended or adjusted under 35 U.S.C. 154(b) by 779 days.

(21) Appl. No.: 11/446,907

(22) Filed: Jun. 5, 2006

(65) Prior Publication Data
US 2006/0250748 A1 Nov. 9, 2006

Related U.S. Application Data

(62) Division of application No. 11/051,994, filed on Feb. 4, 2005, now Pat. No. 7,133,275.

(60) Provisional application No. 60/542,777, filed on Feb. 6, 2004.

(51) Int. Cl.
*B05D 5/12* (2006.01)
*H01G 7/00* (2006.01)
*C23C 14/00* (2006.01)

(52) U.S. Cl. .............. 427/79; 427/80; 29/25.41; 29/25.42; 204/192.1; 204/192.15

(58) Field of Classification Search .......... 427/79, 427/80; 29/25.41, 25.42; 204/192.1, 192.15
See application file for complete search history.

(56) References Cited

U.S. PATENT DOCUMENTS

| | | | |
|---|---|---|---|
| 3,670,222 A | 6/1972 | Nakata et al. |
| 4,124,876 A | 11/1978 | Labadie et al. |
| 4,636,918 A | 1/1987 | Jodoin |
| 4,661,884 A | 4/1987 | Seaman |
| 4,827,323 A | 5/1989 | Tigelaar et al. |
| 5,204,546 A | 4/1993 | Moulding |
| 5,355,277 A | 10/1994 | Hoshiba |
| 5,367,437 A | 11/1994 | Anderson |

(Continued)

FOREIGN PATENT DOCUMENTS

JP 4306818 A 10/1992

OTHER PUBLICATIONS

English language abstract of Japanese Patent No. 4306818 published Oct. 29, 1992.

*Primary Examiner*—Brian K Talbot
(74) *Attorney, Agent, or Firm*—Dority & Manning, P.A.

(57) ABSTRACT

A single layer capacitive device including a portion of pre-fired ceramic material and one or more terminations is formed with manufacturing steps that are easily modified to customize size and other aspects of such devices. The single layer devices may be utilized by themselves or selectively combined with MLCs to form integrated capacitor assemblies yielding many desirable performance characteristics in a monolithic assembly. An exemplary integrated capacitor assembly advantageously provides customized frequency response and capacitance in limited real estate. Predictable and generally constant or "flat" impedance versus frequency is afforded mainly by the properties of the single layer device, while higher capacitance is provided mainly from features of one or more associated MLCs. High structural integrity of exemplary integrated capacitor assemblies is achieved due to the disclosed attachment methods. Exemplary integrated capacitor assembly embodiments of the presently disclosed technology have been found to provide effective DC blocking from 20 kHz to 40 GHz.

16 Claims, 6 Drawing Sheets

U.S. PATENT DOCUMENTS

| | | |
|---|---|---|
| 5,576,926 A | 11/1996 | Monsorno |
| 5,625,528 A | 4/1997 | Devoe et al. |
| 5,687,056 A | 11/1997 | Harshe et al. |
| 5,691,877 A | 11/1997 | Hanamura et al. |
| 5,777,839 A | 7/1998 | Sameshima et al. |
| 5,973,907 A | 10/1999 | Reed |
| 6,077,715 A | 6/2000 | Chivukula et al. |
| 6,212,060 B1 | 4/2001 | Liu |
| 6,310,759 B2 | 10/2001 | Ishigaki et al. |
| 6,337,791 B1 | 1/2002 | Monsorno |
| 6,487,064 B1 | 11/2002 | Monsorno |

INTEGRATED CAPACITOR ASSEMBLY

PRIORITY CLAIM

This application is a divisional of U.S. patent application Ser. No. 11/051,994 filed Feb. 4, 2005, now U.S. Pat. No. 7,133,275, which claims benefit of previously filed U.S. Provisional Patent Application Ser. No. 60/542,777 filed Feb. 6, 2004, all entitled "INTEGRATED CAPACITOR ASSEMBLY" and having the same inventors as present.

FIELD OF THE INVENTION

The present subject matter generally concerns capacitors for use in a relatively wide range of frequency applications. Some aspects of the present subject matter more particularly concern single layer capacitive devices, such as may be uniquely suited for stripline width matching in microwave integrated circuitry and other applications. Other aspects of the present subject matter more particularly concern multiple capacitor components provided in monolithic packages. The present subject matter utilizes interconnect and attachment features to create devices with improved and/or idealized performance characteristics, including relatively small component footprint, robust mechanical assembly, high capacitance and predictable frequency response (i.e., impedance versus frequency) over a wide range of frequencies.

BACKGROUND OF THE INVENTION

The diversity of modern technical applications creates a need for efficient electronic components and integrated circuits for use therein. Capacitors are a fundamental component used for filtering, decoupling, bypassing and other aspects of such modern applications which may include wireless communications, alarm systems, radar systems, circuit switching, matching networks, and many others. The incredible variety of capacitor environments implies that capacitors are often subjected to a number of different operating frequencies. Capacitor technology that can accommodate applications at conventional frequency levels as well as increasing higher frequency applications such as related to wireless communications systems, including satellite, GPS, and cellular applications, must exhibit reliable performance characteristics over a generally wide frequency range.

There are many different performance characteristics of a capacitor for which improvement may be sought to facilitate desired operation. Selected of such characteristics may include high capacitance, small component footprint, robust mechanical assembly, and predictable frequency response over a wide range of frequencies. Achieving many or all of these desired characteristics in a single monolithic structure would help to provide a beneficial capacitive device.

A need for various different performance characteristics in a single electronic component is one of many reasons that previous combinations of multiple capacitors or other devices into a monolithic structure have been made, various known examples of which will now be mentioned.

One example of technology that addresses certain capacitor performance aspects is disclosed in U.S. Pat. No. 5,973,907 (Reed). Reed concerns a multiple element capacitor with different capacitors having common terminals in a case. Exemplary embodiments are designed to exhibit capacitance values of greater than about 0.1 μF and impedance/ESR values that are relatively flat over certain given frequencies.

Additional references that disclose exemplary technology with aspects of component design including size and/or spacing that may be controlled to allow for preselection of desired operative capacitor characteristics include U.S. Pat. Nos. 6,487,064, 6,337,791, and 5,576,926 (Monsarno). Such Monsarno references generally concern internal electrode capacitor embodiments often designed and utilized for desirable high frequency behaviors.

U.S. Pat. No. 5,687,056 (Harshe et al.) discloses chip capacitor devices having various voltage and capacitance properties and lead pins electrically coupled to a capacitor assembly. Exemplary devices include a plurality of capacitor subassemblies arranged in a generally stacked configuration. U.S. Pat. No. 5,355,277 (Hoshiba) concerns a thin film capacitor including a first capacitor composed of a ferroelectric film and a supplemental secondary capacitor composed of a film surrounding the first capacitor.

Other examples of component assemblies featuring one or more integrated capacitor portions can be found in U.S. Pat. No. 5,367,437 (Anderson), U.S. Pat. No. 4,124,876 (Labadie et al.), and U.S. Pat. No. 3,670,222 (Nakata et al.). Anderson discloses multiple layer capacitors stacked on top of one another and then provided in a clamped array formation for subsequent surface mounting. Labadie et al. concerns a modular capacitor made of two elementary capacitors (same or disparate valued) with common leads placed between the capacitors. Such modular arrangement is intended to provide highly accurate capacitance values and high mechanical strength. Nakata et al. discloses an exemplary ceramic capacitor assembly comprising a plurality of ceramic capacitor blocks disposed in a stacked relationship within a tubular insulating housing.

Exemplary background references in addition to those already cited include U.S. Pat. No. 6,212,060 (Liu), U.S. Pat. No. 6,077,715 (Chivukula), U.S. Pat. No. 5,777,839 (Sameshima et al.), U.S. Pat. No. 5,204,546 (Moulding), U.S. Pat. No. 4,827,323 (Tigelaar et al.) and U.S. Pat. No. 4,661,884 (Seaman).

The disclosures of all the foregoing United States patents are hereby fully incorporated for all purposes into this application by reference thereto.

BRIEF SUMMARY OF THE INVENTION

The present subject matter recognizes and addresses various issues as previously discussed, and others concerning certain aspects of capacitor and related electronics technology. Thus broadly speaking, a principal object of the presently disclosed technology is to provide an improved capacitive device. More particularly, a single layer capacitive device and corresponding methodology for producing a plurality of such devices is disclosed. In some embodiments, the resultant single layer devices may be employed in various circuit applications by themselves, such as for stripline width matching in microwave integrated circuitry. In other embodiments, such single layer devices are provided in integrated combination with multilayer capacitors (MLCs) to form integrated capacitor assemblies.

An advantage of the subject single layer devices is that the methodology for forming such devices may be easily modified to adjust for different device dimensions and mounting specifications. Depending on customer preference or application requirements, specific width, height, length, gap width, etc. dimensions may be modified. Also, different types of materials as desired for use in the pre-fired ceramic portion or in various applied portions of metallization that form terminations for the subject single layer devices may be employed.

Another advantage of the present subject matter corresponds to the integrated capacitor assemblies yielding a combination of desired functionality in a single monolithic structure. Such desired functionality includes a relatively high capacitance afforded by one or more MLCs as well as controlled frequency response and DC blocking over a wide range of frequencies (such as between about 20 kHz to 40 GHz). The subject integrated capacitor assemblies also afford an advantage in that such desirable capacitance and impedance versus frequency characteristics are provided in an integrated structure having a relatively small overall footprint for mounting to a given surface.

A still further advantage of some embodiments of the present technology is that integrated capacitor assemblies are provided with simple yet robust mechanical connections. The use of certain bonding materials can achieve integrated assemblies with joints capable of withstanding temperatures of up to about 350 degrees Celsius during final assembly solder attachment. Versatility is also afforded in integration and/or mounting of the subject integrated capacitor assemblies since solder technology, adhesives, and/or wire bonding may selectively be utilized. Additional objects and advantages of the present subject matter are set forth in, or will be apparent to those of ordinary skill in the art from, the detailed description herein. Also, it should be further appreciated by those of ordinary skill in the art that modifications and variations to the specifically illustrated, referenced, and discussed features and steps hereof may be practiced in various embodiments and uses of this subject matter without departing from the spirit and scope thereof, by virtue of present reference thereto. Such variations may include, but are not limited to, substitution of equivalent means and features, materials, or steps for those shown, referenced, or discussed, and the functional, operational, or positional reversal of various parts, features, steps, or the like.

Still further, it is to be understood that different embodiments, as well as different presently preferred embodiments, of the disclosed technology may include various combinations or configurations of presently disclosed features or elements, or their equivalents (including combinations of features or configurations thereof not expressly shown in the figures or stated in the detailed description).

Various first exemplary embodiments of the present subject matter may be based on a single layer device including a pre-fired ceramic layer, one or more portions of a first metallization, and one or more portions of a second metallization. The pre-fired ceramic layer may comprise a portion of dielectric material having a relatively high dielectric constant (K), such as one of NPO (COG), X7R, X7S, Z5U, Y5V and strontium titanate. The first and second portions of metallization may combine to form first and second terminations for the single layer device, and it should be appreciated that each first and second metallization may comprise one or more respective conductive materials. The first and second terminations may be formed such that the ceramic layer is exposed on top and/or bottom surfaces of the single layer device.

A second exemplary embodiment in accordance with the present subject matter corresponds to a single layer device such as one that includes a pre-fired ceramic wafer layer characterized by top and bottom surfaces thereof and first and second terminations for the single layer device. At least one of the first and second terminations is provided on and extends from the top surface of the ceramic wafer layer along a selected side surface and onto the bottom surface of the ceramic wafer layer. The first and second terminations combine to more particularly include one or more portions of a first meallization applied to select areas of the top and bottom surfaces of the ceramic wafer layer as well as one or more portions of a second metallization applied over the one or more portions of first metallization and onto selected side surfaces of the ceramic wafer layer.

In more particular embodiments of the above single layer device, both first and second terminations could be formed in a generally U-shaped fashion extending along selected side surfaces from top to bottom surfaces of the ceramic wafer layer. In some embodiments one termination extends along the entire bottom surface of the ceramic wafer layer, and may also wrap back around to the top surface. The termination portions that extend along selected side surfaces of the ceramic wafer layer are generally thicker than the termination portions that extend along top and bottom surfaces of the ceramic wafer layer.

Yet another exemplary embodiment of the presently disclosed technology corresponds to an integrated capacitor assembly, such as one including a single layer device, at least one multilayer capacitor and respective portions of bonding material. The single layer device may be as described in the above exemplary embodiments, including such elements as a pre-fired ceramic wafer layer and first and second terminations. The multilayer capacitor includes multiple layers of dielectric material that are interleaved with respective pluralities of first and second electrodes, each pair of first and second electrodes forming opposing plates of a capacitor element. The multilayer capacitor also includes a first termination provided along the capacitor periphery and attached to each first electrode as well as a second termination also provided along the capacitor periphery and attached to each second electrode. The respective portions of bonding material attach respective first terminations of the single layer device and the multilayer capacitor and also attach respective second terminations of such devices. A plurality of such multilayer capacitor may be used in combination with such embodiment, to form further present embodiments.

In more particular exemplary integrated capacitor assembly embodiments, the first and second terminations of the single layer device may include selected layers of titanium/tungsten, nickel, chrome and/or gold. The terminations of the multilayer capacitor may include nickel and/or gold. The bonding material may correspond to such materials as a conductive epoxy, tin/lead alloy, gold/tin alloy, or a tin/silver/copper alloy. In some embodiments, each termination of the single layer device and multilayer capacitor as well as the bonding material all at least partially comprise gold.

A still further exemplary embodiment of the present subject matter corresponds to a method for making a plurality of single layer devices, for example, such as those generally described above. A first step in such exemplary methodology corresponds to providing a layer of pre-fired ceramic material. A second (optional) step is to apply metallization to both top and/or bottom surfaces of the pre-fired ceramic layer to form a metallized ceramic layer. In some embodiments, the metallization may be applied by sputtering techniques and the sputtered material may correspond to such exemplary materials as titanium/tungsten (Ti/W) or respective applications of chrome, nickel and gold. Subsequently, a comb cut is made to the metallized ceramic layer to form a first plurality of generally parallel cuts through the thickness of the metallized ceramic layer without cutting fully through the width of the assembly. A resultant "first comb-cut assembly" includes a plurality of extended portions that are connected at a base portion. The first comb-cut assembly is then subjected to a subsequent application of metallization which again coats top and/or bottom surfaces of the assembly as well as exposed side portions formed by the previous comb-cut. The first comb-cut assembly with this subsequent application of metallization is referred to herein as a second comb-cut assembly, which may then be subjected to a plurality of skim cuts at one or more predetermined locations in each extended portion of the second comb-cut assembly. Most skim cuts are preferably formed to expose the pre-fired ceramic layer without cutting through the ceramic. The second comb-cut assembly with skim cuts is referred to herein as a skim-cut assembly. At this point, a second plurality of generally parallel cuts is made completely though the skim-cut assembly in a generally perpendicular direction to the comb-cut and skim-cuts in order to finally individualize respective single layer devices. The dimensions between each respective plurality of comb cut, skim cuts, and final individualizing cuts may be effected at predetermined distances to provide customized components and to accommodate a variety or potential circuit applications.

Still further embodiments of the present subject matter correspond to methods for making a plurality of integrated capacitor assemblies and to the integrated capacitor assemblies thus formed. An exemplary such method elaborates on the above-described exemplary method for making a plurality of single layer devices by integrating one or more multilayer capacitors (MLCs) to each single layer device. Integration may be accomplished by a variety of techniques as known to one of ordinary skill in the art, including use of bonding materials such as selected solder materials or conductive adhesives. The integration of one or more MLCs to each single layer device may occur to the previously described skim-cut assembly or to the single layer devices after being cut to form individual components.

The resultant integrated capacitor assemblies may be formed in accordance with the present subject matter in a variety of different configurations, examples of which will be discussed in greater detail in the remainder of the specification.

The present subject matter equally concerns various exemplary corresponding methodologies for practice and manufacture of all of the herein referenced capacitive devices and integrated assemblies. Still further, it is to be understood that different arrangements of the presently disclosed subject matter may include and incorporate various combinations or configurations of presently disclosed features, steps, or elements, or their equivalents, including combinations of features or steps or configurations thereof not expressly shown in the figures or stated in the detailed description.

Those of ordinary skill in the art will better appreciate the features and aspects of the presently disclosed subject matter upon review of the remainder of the specification.

BRIEF DESCRIPTION OF THE DRAWINGS

A full and enabling description of the presently disclosed subject matter, including the best mode thereof, directed to one of ordinary skill in the art, is set forth in the specification, which makes reference to the appended figures, in which.

Figure 3A:
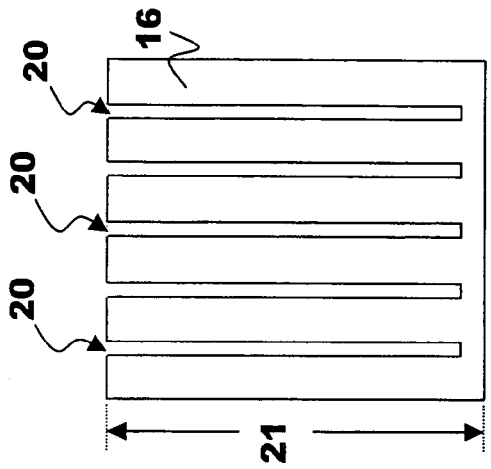
FIGS. 3A and 3B illustrate respective plan and side views of the metallized ceramic layer of FIGS. 2A and 2B with a comb-cut formed through the metallized ceramic layer to form a first comb-cut assembly.

Repeat use of the reference characters throughout the present specification and appended drawings is intended to represent same or analogous features, steps, or other elements of the present technology.

DETAILED DESCRIPTION OF THE PREFERRED EMBODIMENTS

As referenced in the Brief Summary of the Invention section, aspects of the present subject matter are directed towards an improved single layer device and related methodology for making multiple such devices, whereby overall device dimensions can be relatively easily altered. FIGS. 1 through 6B respectively describe various features of such single layer device technology.

Figure 7:
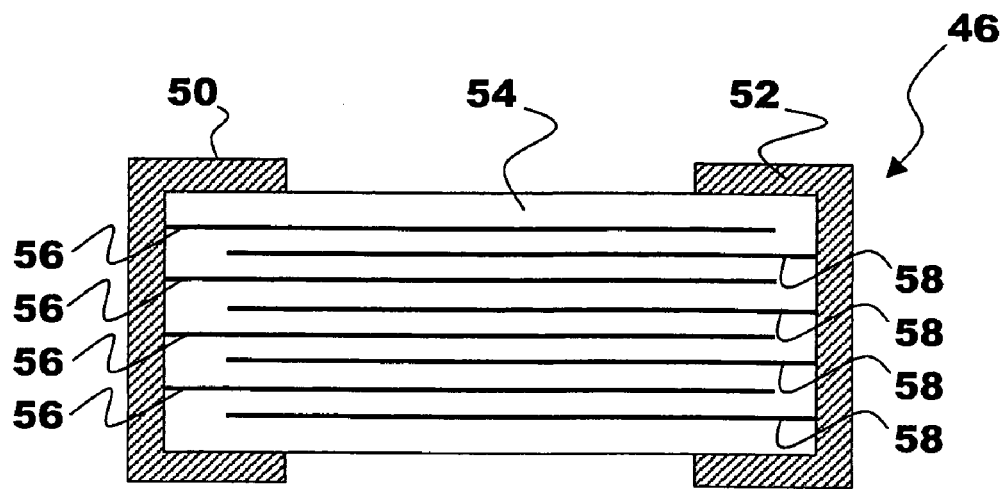
FIG. 7 illustrates a side cross-sectional view of an exemplary multilayer capacitor.
Figure 8:
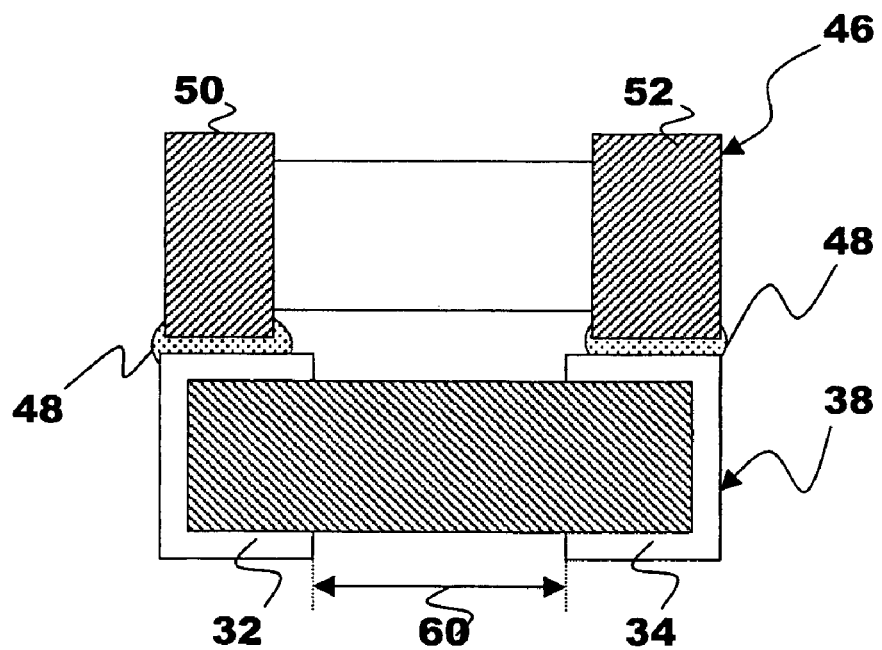
FIG. 8 illustrates a side view of a first exemplary integrated capacitor assembly embodiment in accordance with aspects of the present subject matter.
Figure 9:
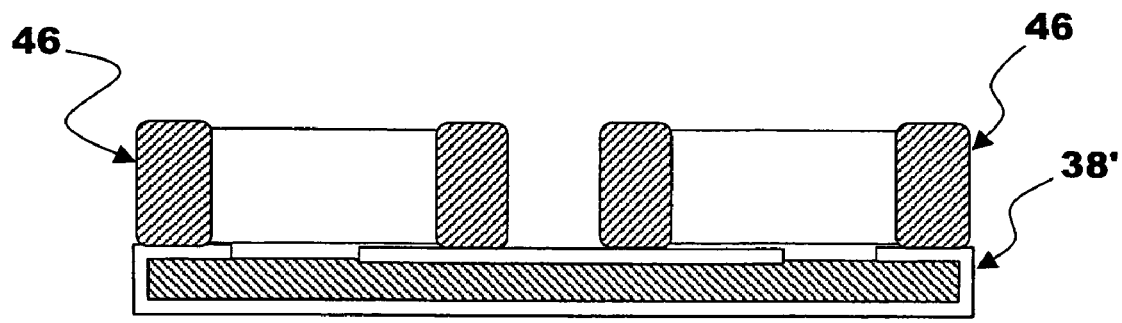
FIG. 9 illustrates a side view of a second exemplary integrated capacitor assembly embodiment in accordance with aspects of the present subject matter.
Figure 10:
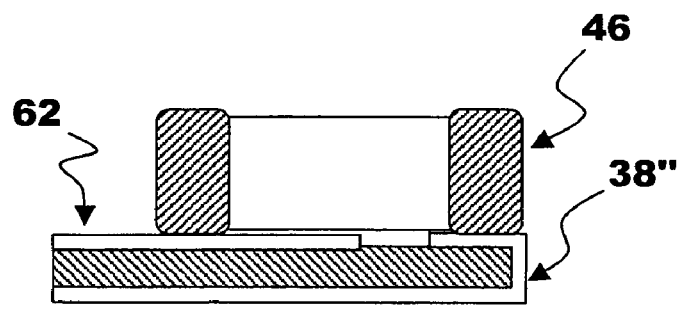
FIG. 10 illustrates a third exemplary embodiment in accordance with the present subject matter.

Additional embodiments of the present subject matter combine aspects of the aforementioned single layer capacitor technology with multilayer capacitor technology (such as depicted in FIG. 7) into an integrated capacitor assembly. Various exemplary embodiments of such an integrated capacitor assembly are illustrated in FIGS. 8, 9 and 10.

Reference will now be made to the single layer capacitive device of the present subject matter, which is constructed with robust and versatile attachment features. Such construction affords a variety of device dimensions, which yields effective device performance over a wide range of operating frequencies.

Figure 1A:
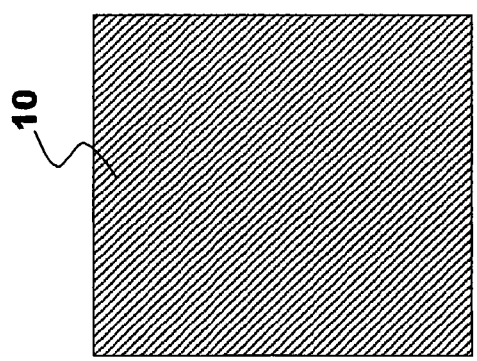
FIGS. 1A and 1B illustrate respective plan and side views of an exemplary ceramic wafer layer in accordance with aspects of a single layer device component of the present subject matter.
Figure 1B:
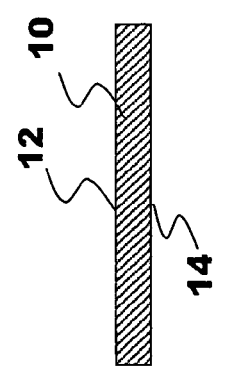

Referring now to FIGS. 1A and 1B, a first step in a method for producing a plurality of single layer devices in accordance with the present subject matter is to provide a pre-fired ceramic wafer 10. Respective plan and side views of ceramic wafer 10 are depicted in FIGS. 1A and 1B respectively.

Ceramic wafer 10 may be formed of a material having a relatively high dielectric constant (K), such as one selected from a range of about 1 to about 40,000 in some embodiments. In other embodiments, ceramic wafer 10 has a dielectric constant selected from within a range of about 10 to about 40,000 and in still further exemplary embodiments, the dielectric constant of ceramic wafer 10 is between about 3,000 and about 40,000. Particular examples of the type of material comprising ceramic wafer 10 include NPO (COG), X7R, X7S, Z5U, and/or Y5V. It should be appreciated that the aforementioned materials are described by their industry-accepted definitions, some of which are standard classifications established by the Electronic Industries Alliance (EIA), and as such should be recognized by one or ordinary skill in the art. Ceramic wafers comprising various forms of NPO (COG) are characterized by dielectric constants in a range of up to about 100. X7R and X7S may exhibit dielectric constants in a range from about 3,000-7,000 and Z5U and Y5V may exhibit dielectric constants as high as 40,000. Another specific example of a ceramic wafer characterized by such a high dielectric constant is formed with a strontium titanate Grain Boundary Barrier Layer (GBBL) dielectric system.

Figure 2A:
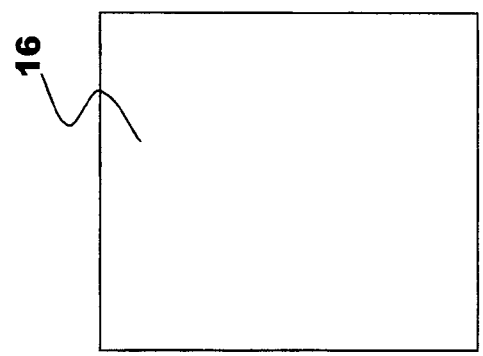
FIGS. 2A and 2B illustrate respective plan and side views of the exemplary ceramic wafer layer of FIGS. 1A and 1B after metallization is applied to both top and bottom surfaces of the wafer.
Figure 2B:
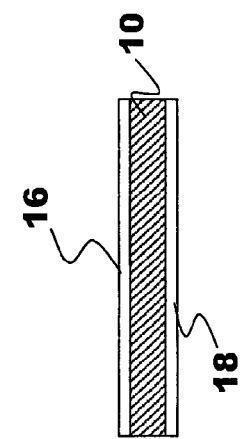

Referring now to FIGS. 2A and 2B, first and second layers of metallization 16 and 18 are applied to respective top and bottom surfaces 12 and 14 (as depicted in FIG. 1B) of ceramic wafer 10. Metallization layers 16 and 18 may in some embodiments respectively comprise a sputtered titanium/tungsten (Ti/W) alloy, respective sputtered layers of chrome, nickel and gold, or any other combination of one or more suitable conductive materials. Metallization layers comprising Ti/W accommodate characterization of the wafer electrically and makes chemical etching unnecessary prior to subsequent application of metallization. In some embodiments the thickness of each respective metallization layer 16 and 18 may range from about 1000 Angstroms (0.1 microns) to as high as about 20,000 Angstroms (2.0 microns).

It should be appreciated in accordance with some embodiments of the present technology that the step of applying metallization portions 16 and 18 as depicted in FIGS. 2A and 2B, respectively, may be optional. In such cases, the subsequent step of forming a comb-cut as will now be described with reference to FIGS. 3A and 3B is performed on the ceramic wafer layer 10 (without metallization 16 and 18 sputtered thereon).

Figure 3B:
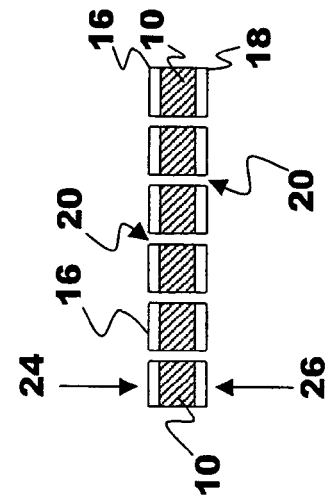

Referring now to the respective plan and side views of FIGS. 3A and 3B, multiple cuts 20 are made through the metallized ceramic layer of FIGS. 2A and 2B. The cuts 20 are made through the thickness of the ceramic 10, but not completely through the width of the metallized ceramic layer so that process-efficient array grouping is maintained for the remainder of the device construction. Such a cutting process is referred to herein as a comb-cut, and the assembly depicted in FIGS. 3A and 3B will thus be referred to herein as a first comb-cut assembly. The cuts made in forming the first comb-cut assembly depicted in FIGS. 3A and 3B may be made in some embodiments of the present technology by a diamond-cut blade saw.

Figure 4A:
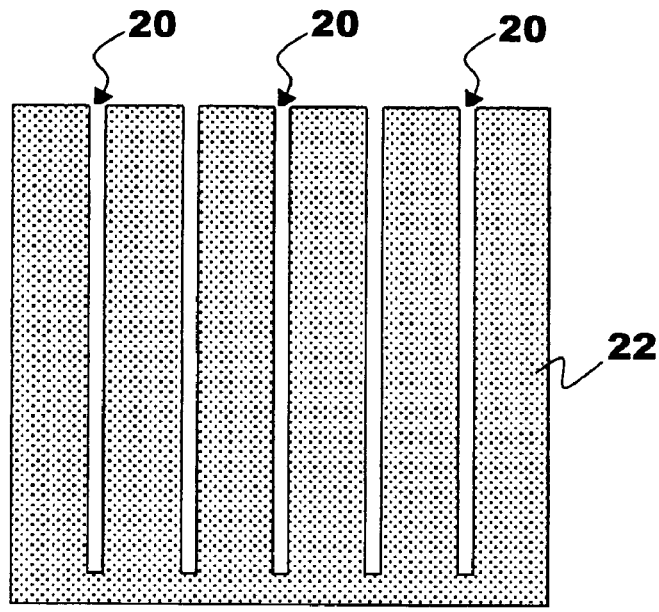
FIGS. 4A and 4B illustrate respective plan and side views of the comb-cut assembly of FIGS. 3A and 3B after being subjected to further application of metallization to form a second comb-cut assembly in accordance with aspects of a single layer capacitor component of the present subject matter.
Figure 4B:
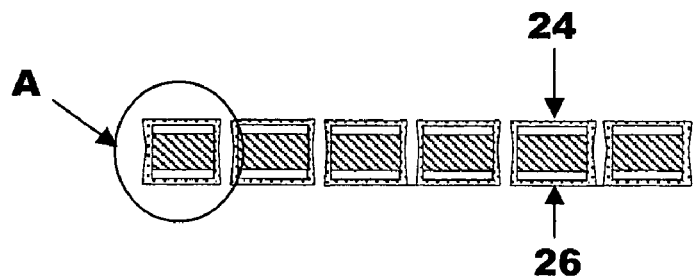

After the comb-cut made as depicted in FIGS. 3A and 3B, the first comb-cut assembly is put back into a sputtering machine or subjected to another process as known to one of ordinary skill in the art for applying metallization. Referring now to FIGS. 4A and 4B, a second comb-cut assembly is depicted after this subsequent application of metallization 22. Such application of metallization 22 coats respective top and bottom surfaces of the first comb-cut assembly of FIGS. 3A and 3B while penetrating the cuts 20 and coating the exposed portions of ceramic wafer 10. Metallization 22 on the second comb-cut assembly of FIGS. 4A and 4B is formed by applying metallization to the top surface 24 of the first comb-cut assembly of FIGS. 3A and 3B as well as to the bottom surface 26. Each application to top and bottom surfaces reaches the inner exposed walls 28 of the second comb-cut assembly in FIGS. 4A and 4B (as seen in the detailed view A of FIG. 4C). As such, the amount of metallization applied to walls 28 is generally thicker than that effected on top surface 24 or bottom surface 26. The metallization 22 depicted in FIGS. 4A through 4C, respectively, may correspond in some embodiments to application of multiple metallic layers, such as another layer of Ti/W followed by application of nickel (Ni) and then a layer of gold (Au).

Figure 4C:
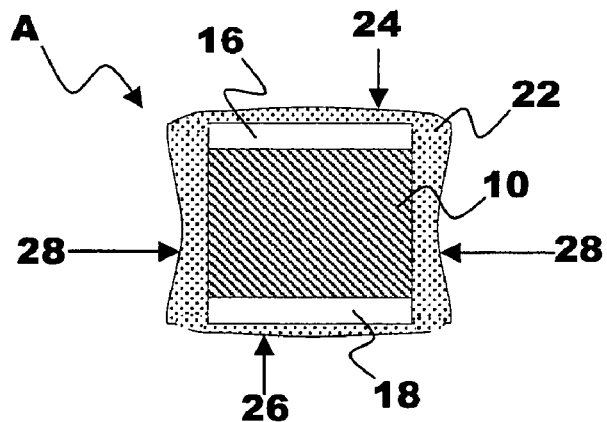
FIG. 4C illustrates a detailed side view of portion A of FIG. 4B.
Figure 5A:
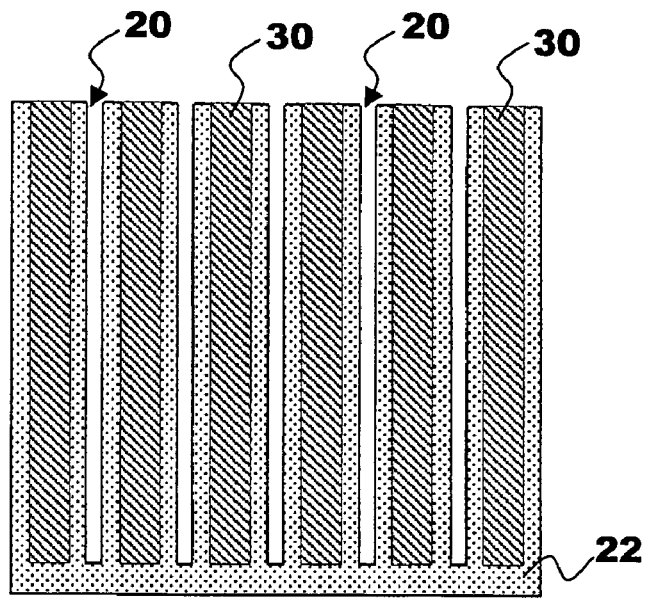
FIGS. 5A and 5B illustrate respective plan and side views of the second comb-cut assembly of FIGS. 4A and 4B after being subjected to a skim-cut to form a skim-cut assembly in accordance with aspects of a single layer capacitor component of the present subject matter.
Figure 5B:
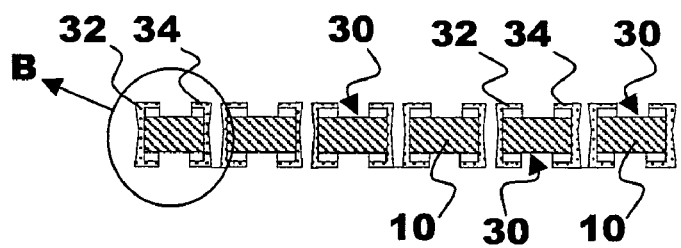
Figure 5C:
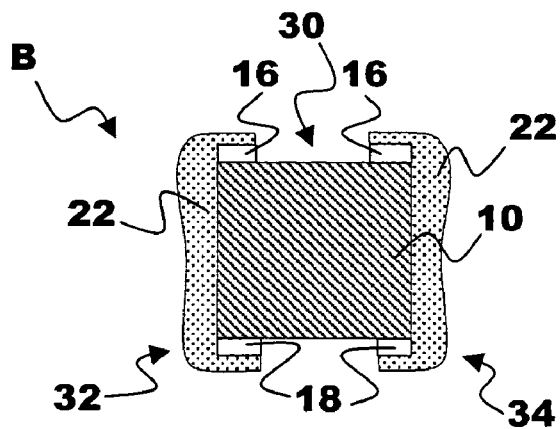
FIG. 5C illustrates a detailed side view of portion B of FIG. 5A.

After the application of metallization 22 as depicted in FIGS. 4A through 4C respectively, a plurality of skim cuts 30 are made to the second comb-cut assembly, as now depicted in the skim-cut assembly FIGS. 5A through 5C. Skim cuts 30 are intended to cut just barely into the ceramic wafer 10 to separate the metallization in each extended portion of the comb assembly into two distinct metallization portions 32 and 34. Although FIGS. 5A through 5C respectively illustrate skim cuts being made in both top and bottom portions of the comb assembly, it should be appreciated that in some embodiments, skim cuts are only made on one selected top or bottom side of the assembly.

After the skim cuts are made as depicted in FIGS. 5A through 5C, a plurality of cuts 36 are made in a generally perpendicular direction to the previous skim cuts 30 and comb cuts 20 such that a plurality of individualized single layer devices 38 are created. Each single layer device 38 features a portion of ceramic wafer 10 with respective generally U-shaped terminations 32 and 34. It should be noted that although terminations 32 and 34 appear in FIGS. 6A and 6B as single portions of metallization, this is illustrated merely for simplicity. Each termination 32 and 34 actually comprises respective portions of metallization 16, 18 and 22.

Figure 6A:
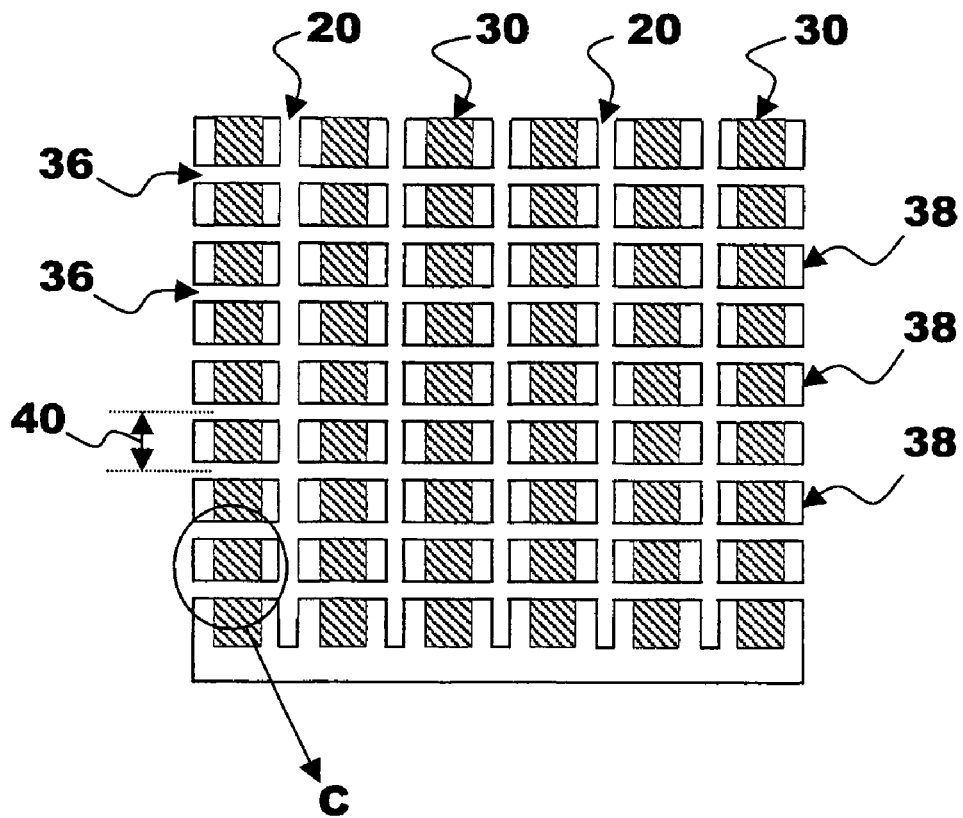
FIG. 6A illustrates a plan view of the skim-cut assembly of FIGS. 5A and 5B after being subjected to a plurality of cuts for individualizing exemplary single layer components in accordance with the present subject matter.
Figure 6B:
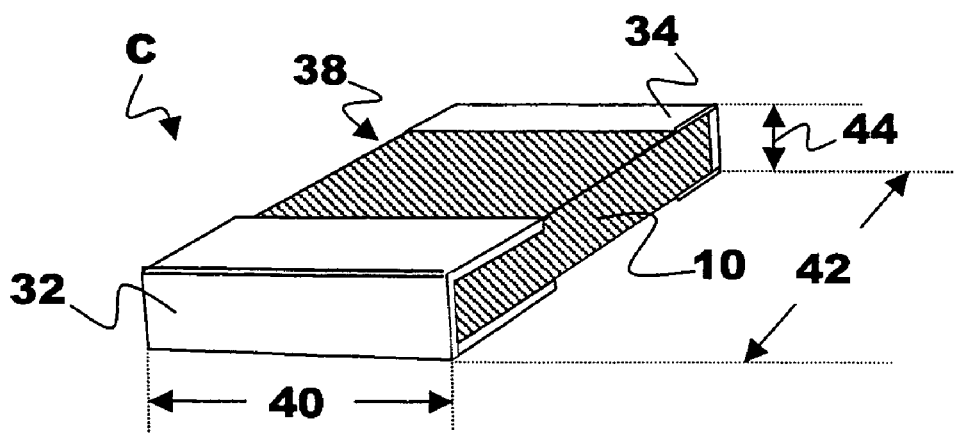
FIG. 6B illustrates a detailed perspective view of an individual single layer capacitor component such as generally represented in portion C of FIG. 6A in accordance with aspects of the present subject matter.

Referring still to FIGS. 6A and 6B, the distance 40 between cuts 36 may be varied as desired to create customized component widths (as depicted in detailed view C of FIG. 6B). Exemplary values for component width may range from between about 0.015" and 0.050", but embodiments of the present subject matter should in no way be limited to such exemplary dimensions. It should be appreciated that devices in accordance with the present technology can be designed for mounting to any given stripline width or in accordance with other suitable circuit interfaces. Further exemplary dimensions for single layer device 38 correspond to a length 42 ranging from between about 0.040" and about 0.080" and a height 44 ranging from between about 0.005" and about 0.020", but also should not be considered limiting to the presently disclosed technology. An exemplary value for the width between terminations 32 and 34 (depicted in FIG. 8 as gap width 60) may be between about 0.010" and 0.020" in some embodiments.

The unique configuration of single layer component 38 facilitates simple and rugged connections in a variety of different circuit applications. Single layer component 38 may be utilized in such applications by itself (for example, for stripline width matching in microwave integrated circuitry) or in integrated combination with other features, such as now presented with respect to FIGS. 7 through 10 respectively.

One exemplary embodiment of an integrated capacitor assembly in accordance with aspects of the presently disclosed technology is illustrated in FIG. 8, whereby a single layer device 38 is mated with a multilayer capacitor (MLC) 46 via one or more respective portions of bonding material 48.

A more detailed representation of an exemplary MLC 46 is illustrated in FIG. 7. MLC 46 includes multiple layers of dielectric material that are fired to form a body of dielectric material 54 when interleaved with respective pluralities of first electrodes 56 and second electrodes 58. Each respective pair of first electrodes 56 and second electrodes 58 forms opposing plates of a capacitor element, with multiple opposing pairs combined in parallel to yield an overall capacitance of the MLC component 46. Although only four pairs of first and second electrode plates 56, 58 are illustrated in FIG. 7, it should be appreciated that any number of electrode plates may be utilized in accordance with the present subject matter. The number of electrode plates may actually be much higher in some preferred embodiments. Respective first electrode plates 56 and second electrode plates 58 can be formed in a variety of desired shapes, as long as a portion of each first electrode 56 is electrically connected to first MLC termination 50 and a portion of each second electrode 58 is electrically connected to second MLC termination 52. First and second electrode terminations in one exemplary embodiment correspond to respective layers of plated nickel (Ni) followed by plated gold (Au). Examples of materials for use in the electrode plates 56 and 58 and the body of dielectric material 54 are various. These and other conventional aspects of MLCs are generally well known to those of ordinary skill in the art. As such, no further discussion of such materials or of other details concerning the MLC 46 depicted in FIG. 7 are now presented.

Referring again to FIG. 8, mating of respective MLCs 46 to single layer devices 38 may occur after creation of multiple individual single layer devices 38, such as depicted and discussed with reference to FIG. 6A. Mating of multiple MLCs 46 may alternatively occur before the last series of device cuts is made in FIG. 6A, at respective predetermined locations of an assembly such as illustrated in FIG. 5A. By positioning and mating MLC 46 and single layer device 38 in the orientation depicted in FIG. 8, the opportunity for magnetic flux to cause interference at gaps between the two integrated components is minimized.

In some examples, bonding material 48 corresponds to conductive epoxy, a tin/lead (Sn/Pb) alloy, a gold/tin (Au/Sn) alloy, a tin/silver/copper (Sn/Ag/Cu or "SAC") alloy, or other suitable conductive alloy or conductive material. In one particular exemplary embodiment, single layer device 38 with terminations 32 and 34 each comprising at least one layer of gold metallization and MLC 46 with terminations 50 and 52 also comprising at least one layer of gold are attached via a bonding material 48 comprising an 80/20 gold/tin eutectic solder material. The mixing of gold from the respective terminations 32 and 34 of single layer device 38 and respective terminations 50 and 52 of MLC 46 with such an exemplary gold/tin solder material raises the eutectic point making the joint between respective terminations of the single layer device 38 and MLC 46 generally capable of withstanding temperatures of up to 350 degrees Celsius during the final assembly solder attachment of the integrated capacitor assembly to a circuit board or other suitable mounting surface. In some embodiments, the above-listed exemplary materials for possible use as bonding material 48 may also be used as solder or other material for attaching the integrated capacitor assembly of FIG. 8 to its desired mounting environment. Furthermore, although not specifically illustrated, it should be appreciated that wire bonding techniques as are well known in the art may be utilized for attaching an integrated capacitor assembly to a mounting surface.

It should be appreciated that many variations to the exemplary integrated capacitor assembly of FIG. 8 are appreciated and may be practiced in accordance with the present technology. Some exemplary such variations are depicted in the alternative integrated capacitor assembly embodiments of FIGS. 9 and 10. For example, referring to FIGS. 9 and 10, single layer devices 38' and 38" are formed with skim cuts only on one selected top or bottom surface of the device.

Referring now to FIG. 9, two MLCs 46 may be mounted to one single layer device 38 as illustrated. In order to construct the integrated capacitor assembly of FIG. 9, slight modifications may be made to the manufacturing process already discussed with respect to FIGS. 1 through 6. For example, the comb cuts 20 made as depicted in FIG. 3A may be made at greater distances from one another to provide a generally greater surface area on the assembly for accommodating more than one MLC. The skim cuts made as depicted in FIGS. 5A through 5C would alternatively be made such that two skim cuts are made on a selected top or bottom surface of each extended portion of the comb assembly, with no skim cuts on the opposite surface. Pairs of MLCs 46 may then be mounted either to respective portions of the assembly depicted in FIG. 5A before further cutting or to individualized single layer devices after the final round of cuts are effected as illustrated in FIGS. 6A and 6B. In still further embodiments of the present subject matter, it should be appreciated that more than two MLCs 46 may be mounted to a given single layer device.

Manufacture of the exemplary integrated capacitor embodiment of FIG. 10 may simply require an additional step to the process described above for forming the embodiment of FIG. 9. For example, a single cut through the center of an integrated capacitor assembly as depicted in FIG. 9 would result in two integrated capacitor assemblies of FIG. 10. Instead of having to cut each individual part, that step could alternatively be effected after adding a plurality of MLCs to the assembly as depicted in FIG. 5A (or similar alternatives) but before the final round of cuts in a generally perpendicular direction are made as depicted in FIGS. 6A and 6B. Although not illustrated in FIGS. 9 and 10, bonding material 48 as illustrated and discussed with reference to FIG. 8 may also be utilized for attachment purposes. The integrated capacitor assembly of FIG. 10 may be particularly well suited for attachment to a mounting surface via wire bonding since single layer device 38' is longer than MLC 46 creating what may be used as a wire bond pad 62.

An integrated capacitor assembly in accordance with the present subject matter provides many desirable performance characteristics for certain circuit applications. Such an assembly advantageously provides frequency response and capacitance in limited real estate. Predictable and generally constant or "flat" impedance versus frequency is afforded mainly by the properties of the single layer device 38, while higher capacitance is provided mainly from features of the MLC 46. In one exemplary integrated capacitor assembly embodiment of the present technology, a single layer device 38 provides between about 60-80 pF of capacitance and may range as high as about 180 pF in some embodiments, while MLC 46 provides anywhere from between about one µF and one mF or more of capacitance. Still further, high structural integrity of the integrated capacitor assembly is achieved due to the attachment methods described herein. Exemplary integrated capacitor assembly embodiments of the presently disclosed technology have been found to provide effective DC blocking from 20 kHz to 40 GHz.

It should be appreciated that reference herein to top, bottom and/or side surfaces of the various respective layers and assemblies of the present technology are used for the sake of convenience and should not insinuate any unnecessary limitations to specific orientation of such layers and assemblies.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method of making a plurality of electronic devices, comprising the steps of:
   providing a layer of pre-fired ceramic material;
   forming a first plurality of generally parallel cuts through the thickness of said layer of pre-fired ceramic material without cutting fully through the width of said layer of pre-fired ceramic material, forming a first comb-cut assembly including a plurality of extended portions that are connected at a base portion, said first comb-cut assembly characterized by respective top and bottom surfaces thereof;
   applying metallization to both top and bottom surfaces of said first comb-cut assembly, whereby a portion of metallization is configured to coat selected respective sides of the plurality of extended portions, forming a second comb-cut assembly characterized by respective top and bottom surfaces thereof;
   forming a plurality of skim cuts along said second comb-cut assembly, wherein each skim cut is formed generally parallel to the first plurality of generally parallel cuts and wherein each skim cut exposes said layer of pre-fired ceramic material without cutting completely through the ceramic material, forming a skim-cut assembly; and
   forming a second plurality of generally parallel cuts through said skim-cut assembly, wherein said second plurality of generally parallel cuts are formed in a generally perpendicular direction to said first plurality of generally parallel cuts and said plurality of skim cuts, thus forming a plurality of individual electronic devices.

2. The method of claim 1, further comprising a step before said step of forming a first plurality of generally parallel cuts of applying metallization to both top and bottom surfaces of the layer of pre-fired ceramic material to form a metallized ceramic layer, and wherein said step of forming a first plurality of generally parallel cuts comprises forming said first plurality of cuts through said metallized ceramic layer without fully cutting through the width thereof.

3. The method of claim 2, wherein said step of applying metallization to top and bottom surfaces of the layer of pre-fired ceramic material comprises sputtering at least one layer of material selected from a group consisting of titanium/tungsten alloy, chrome, nickel and gold.

4. The method of claim 2, wherein said step of applying metallization to top and bottom surfaces of the layer of pre-fired ceramic material comprises sequentially executed steps of:
   applying at least one layer of chrome;
   applying at least one layer of nickel; and
   applying at least one layer of gold.

5. The method of claim 1, further comprising a step of attaching a plurality of multilayer capacitors to selected locations along said skim-cut assembly.

6. The method of claim 1, further comprising a step of attaching a multilayer capacitor to selected of said individual electronic devices effected by said step of forming a second plurality of generally parallel cuts.

7. The method of claim 1, wherein said step of applying metallization to both top and bottom surfaces of said first comb-cut assembly comprises sputtering at least one layer of material selected from a group consisting of titanium/tungsten alloy, chrome, nickel and gold.

8. The method of claim 1, wherein said step of applying metallization to both top and bottom surfaces of said first comb-cut assembly comprises sequentially executed steps of:
   applying at least one layer of titanium/tungsten alloy;
   applying at least one layer of nickel; and
   applying at least one layer of gold.

9. The method of claim 1, wherein selected of said steps of forming a first plurality of cuts and forming a second plurality of cuts are effected with a diamond-cut blade saw.

10. The method of claim 1, wherein said step of forming a plurality of skim cuts comprises forming a skim cut in the top surface of each said extended portion of said first comb-cut assembly and forming a skim cut in the bottom surface of each extended portion of said first comb-cut assembly.

11. The method of claim 10, further comprising a step of attaching a plurality of multilayer capacitors to each extended portion of said skim-cut assembly, such that selected of said plurality of individual electronic devices effected by said step of forming a second plurality of generally parallel cuts comprise an integrated combination of a single layer device and at least one multilayer capacitor.

12. The method of claim 10, further comprising a step of attaching one or more multilayer capacitors to selected of said individual electronic devices effected by said step of forming a second plurality of generally parallel cuts.

13. The method of claim 1, wherein said step of forming a plurality of skim cuts comprises forming two generally parallel skim cuts in the top surface of each said extended portion of said first comb-cut assembly.

14. The method of claim 13, further comprising a step of attaching a plurality of multilayer capacitors to each extended portion of said skim-cut assembly, such that selected of said plurality of individual electronic devices effected by said step of forming a second plurality of generally parallel cuts comprise an integrated combination of a single layer device and two or more multilayer capacitors.

15. The method of claim 13, further comprising a step of forming a third plurality of cuts generally parallel to said first plurality of cuts and said plurality of skim cuts, wherein each of said third plurality of cuts is formed between the two generally parallel skim cuts in the top surface of each said extended portion of said first comb-cut assembly.

16. The method of claim 13, further comprising a step of attaching one or more multilayer capacitors to selected of said individual electronic devices effected by said step of forming a second plurality of generally parallel cuts.

* * * * *

UNITED STATES PATENT AND TRADEMARK OFFICE
CERTIFICATE OF CORRECTION

PATENT NO. : 7,641,933 B2
APPLICATION NO. : 11/446907
DATED : January 5, 2010
INVENTOR(S) : Purple et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 884 days.

Signed and Sealed this

Sixteenth Day of November, 2010

David J. Kappos
*Director of the United States Patent and Trademark Office*